United States Patent [19]

Kimura

[11] Patent Number: 5,331,134
[45] Date of Patent: Jul. 19, 1994

[54] DOUBLE-LAYERED CERAMIC HEATER

[75] Inventor: Noboru Kimura, Gunma, Japan

[73] Assignee: Shin-Etsu Chemical Co., Ltd., Tokyo, Japan

[21] Appl. No.: 62,133

[22] Filed: May 17, 1993

[30] Foreign Application Priority Data

May 21, 1992 [JP] Japan .................. 4-154349

[51] Int. Cl.⁵ .................. H05B 3/20; H05B 3/10; H05B 3/16
[52] U.S. Cl. .................. 219/543; 118/725
[58] Field of Search .............. 338/306, 307, 308, 309, 338/310, 311, 312, 313, 314; 219/543, 457, 465, 466, 467, 468, 552, 553, 464; 118/725; 437/247, 248

[56] References Cited

U.S. PATENT DOCUMENTS 4,901,051 2/1990 Murata et al. .................. 338/308
5,059,770 10/1991 Mahawili .................. 219/464

FOREIGN PATENT DOCUMENTS 1123403 9/1956 France .................. 338/308
63-241921 10/1988 Japan .................. 118/725
64-77930 3/1989 Japan .................. 118/725
3-30393 2/1991 Japan .
3-235325 10/1991 Japan .................. 118/725
4-79182 3/1992 Japan .................. 219/465
4-112478 4/1992 Japan .

Primary Examiner—Geoffrey S. Evans
Attorney, Agent, or Firm—McAulay Fisher Nissen Goldberg & Kiel

[57] ABSTRACT

Proposed is an improved double-layered ceramic heater consisting of an insulating ceramic base plate and two patterned resistance heater element layers formed on both surfaces of the base plate. The improvement comprises forming the patterned heater element layers in such a fashion that the gap space of the heater element layer on one surface, where no heat is evolved by energizing, is opposite face-to-face with the complementary heat-evolving area of the heater element layer on the other surface of the base plate so as to improve uniformity of the temperature distribution over the whole surface of the ceramic heater.

4 Claims, 2 Drawing Sheets

FIG. 1a
FIG. 1b
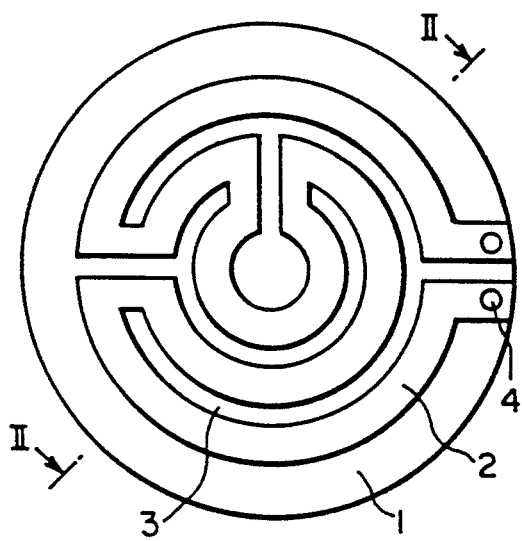
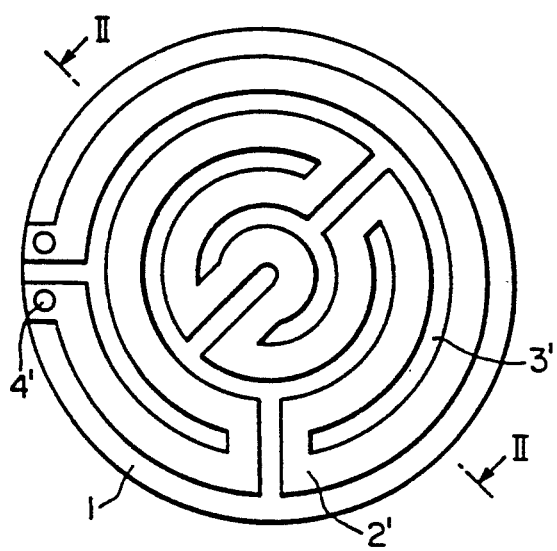
FIG. 2
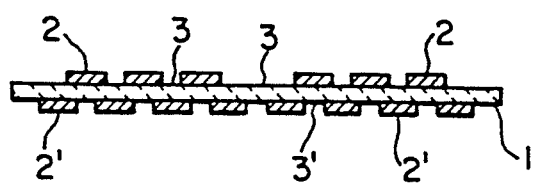
FIG. 3
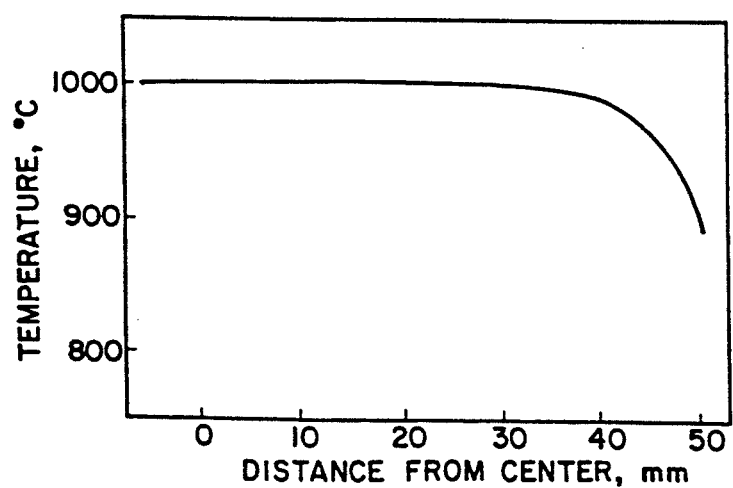

DOUBLE-LAYERED CERAMIC HEATER

BACKGROUND OF THE INVENTION

The present invention relates to a double-layered ceramic heater consisting of an electrically insulating ceramic base plate and two patterned electric resistance heater element layers formed on both surfaces of the ceramic base plate or, more particularly, to a double-layered ceramic heater of the above described structure on which greatly improved uniformity can be obtained in the distribution of temperature.

In the manufacturing process of various kinds of electronic devices such as ICs, LSIs and the like which are prepared from a semiconductor silicon wafer by finely working thereon, the silicon wafers as the substrate are sometimes heated at a high temperature in various processes such as molecular beam epitaxy, chemical vapor-phase deposition method, sputtering method, ion-implantation method and the like by mounting the silicon wafer on a plate-formed heater in a vacuum chamber for the treatment.

A typical plate-formed heater used in the above mentioned purpose is a so-called ceramic heater having, preferably, a structure consisting of a base plate made from an electrically insulating ceramic material such as pyrolytic boron nitride, hereinafter referred to as PBN, and a resistance heater element layer formed thereon from pyrolytic graphite, hereinafter referred to as PG, as is disclosed in Japanese Patent Kokai 63-241921. Ceramic heaters of this type are advantageous as compared with conventional tantalum-wire heaters in respect of the handiness of easy mounting and absence of troubles due to thermal deformation, line break and short-circuiting in addition to the relatively good uniformity of the temperature distribution as an inherency in plate heaters in general.

In order to ensure further improved uniformity of temperature distribution over the whole surface of such a ceramic heater, a proposal is made in Japanese Utility Model Kokai 3-30393 to increase the quantity of heat evolution per unit area with a gradient in the radial direction from the center to the periphery of a circular ceramic heater. It is also disclosed in Japanese Patent Kokai 4-112478 to form two resistance heater element layers on both surfaces of a ceramic base plate with an object to improve the temperature balance in the direction of thickness of the ceramic base plate. The improvement obtained with these double-layered ceramic heaters is still insufficient in respect of the uniformity of temperature distribution because the resistance heater element layer is always patterned on the surface of the ceramic base plate to have a gap area where no heat can be evolved between the patterned heat-evolving or heating areas.

SUMMARY OF THE INVENTION

The present invention accordingly has an object to provide an improvement in a double-layered ceramic heater by which the above-mentioned problems in the conventional double-layered ceramic heaters relative to the uniformity of temperature distribution over the whole surface of the heater plate can be solved.

Thus, the improvement provided by the invention in a double-layered ceramic heater, which consists of an electrically insulating ceramic base plate and two resistance heater element layers formed on the upper and lower surfaces of the ceramic base plate each in a pattern having, on the surface of the ceramic base plate, a heating area covered by the resistance heater element layer where heat is evolved by electric resistance and a gap area where the resistance heater element layer is not formed, comprises forming the resistance heater element layers each in such a pattern that the gap area of the heater element layer on the upper surface of the base plate is opposite face-to-face with the heating area on the lower surface and the gap area on the lower surface of the base plate is opposite face-to-face with the heating area on the upper surface with the ceramic layer in between.

BRIEF DESCRIPTION OF THE DRAWING

FIGS. 1a and 1b are each a plan view of the double-layered ceramic heater as an embodiment of the invention showing the upper surface and lower surface, respectively.

FIG. 2 is an axial cross sectional view of the double-layered ceramic heater illustrated in FIGS. 1a and 1b as cut and viewed along the arrows II—II in FIGS. 1a and 1b.

FIG. 3 is a graph showing the temperature distribution along a radius on the inventive double-layered ceramic heater shown in FIGS. 1a, 1b and 2.

DETAILED DESCRIPTION OF THE PREFERRED EMBODIMENTS

Figure 4:
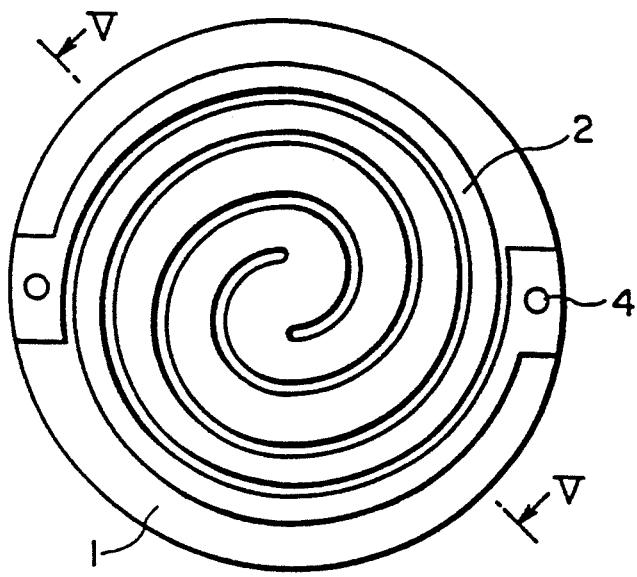
FIG. 4 is a plan view of a conventional single-layered ceramic heater.

As is described above, the most characteristic feature of the improvement according to the invention consists in the complementary patterning of the two electric resistance heater element layers on both surfaces of an insulating ceramic base plate in such a fashion that the gap area of the heater element layer on one surface is opposite face-to-face with the heating area of the patterned heater element layer on the other surface with the insulating layer of the ceramic base plate interposed therebetween. When the two heater element layers are patterned in such a complementary fashion, the otherwise uneven temperature distribution can be made even because a gap area in a single-layered ceramic heater, which is unavoidably at a somewhat lower temperature than in the heating area, can be heated up complimentarily by the heat evolved in the heating area of the heater element layer provided on the other surface of the interposed ceramic layer.

The double-layered ceramic heater according to the improvement of the invention is illustrated below with reference to the accompanying drawing. FIGS. 1a and 1b illustrate each a plan view of the upper and lower surfaces, respectively, of an example of such a double-layered ceramic heater in a circular form having a diameter of 100 mm, of which each of the heater element layers with a pair of terminals 4, 4 and 4', 4' is patterned in such a fashion as to have a line-wise gap area 3 and 3', respectively, running between two adjacent turns of the heating areas 2 and 2' formed on a ceramic base plate 1. FIG. 2 illustrates an axial cross sectional view of such a double-layered ceramic heater shown in FIGS. 1a and 1b as cut and viewed along the arrows II—II. As is clear from this cross sectional view, five gap portions 3, 3, ... appear in the cross section of the upper heater element layer each between the heating portions 2, 2, ... of the heater element layer while the cross section of the lower heater element layer has seven gap portions 3', 3', ... and eight heating portions 2', 2', ....

When the terminals 4, 4 of the upper heater element layer 2 are connected to a power supply source, heat evolution in the heater element layer 2 is naturally limited within the heating area 2 without heat evolution in the gap area 3 to cause an uneven temperature distribution assuming that the ceramic heater be a single-layered one. In this inventive double-layered ceramic heater, however, the gap area 3 on the upper surface of the base plate 1 has a complementary back-up heating area 2' opposite face-to-face on the lower surface of the base plate 1 so that, when the terminals 4', 4' of the lower heater element layer 2' are connected to a power supply source, the deficiency of heat evolution in the gap space 3 on the upper surface of the base plate 1 can be compensated for by the heat evolution in the heating area 2' on the lower surface so that the otherwise uneven temperature distribution on the upper surface can be smoothened.

It is preferable that the width of the gap space area in one heater element layer is at least 0.5 mm or, more preferably, in the range from 0.5 to 5.0 mm and smaller than the width of the heating area A too narrow width of the gap space may lead to the troubles due to poor insulation between the heating areas and occurrence of electric discharge therebetween such as sparks. On the other hand, when the width of the gap space area is too large or, in particular larger than the width of the heating area, the compensatory effect on the temperature distribution by the heater element layer on the other surface of the ceramic layer would be insufficient.

The insulating ceramic material forming the base plate 1 is not particularly limitative including boron nitride, silicon nitride, alumina, aluminum nitride and the like. It is preferable that the insulating ceramic base plate 1 is formed from pyrolytic boron nitride (PBN). Thickness of the ceramic base plate 1 is preferably in the range from 0.5 to 5.0 mm. When the thickness is too small, the ceramic heater cannot be imparted with mechanical strengths to withstand handling in practical use. When the thickness is too large, on the other hand, the ceramic heater would have poor response to the heat evolution in the lower heater element layer 2' due to the excessively large heat capacity of and low heat conduction through the ceramic base plate 1 in addition to the disadvantage due to the too large weight thereof.

The electroconductive material forming the resistance heater element layers 2, 2' is also not particularly limitative depending on the particular intended application of the ceramic heater and can be selected from conventional ones including refractory metals such as tungsten, tantalum, molybdenum and the like and other metals such as titanium, platinum and the like capable of serving as a resistance heater element as well as non-metallic materials such as carbon. The patterned layer of these electroconductive materials can be formed by various known methods such as chemical vapor-phase deposition method, sputtering method, vapor deposition method and the like without particular limitations. The thickness of the heater element layers and the pattern thereof also can be freely selected depending on the particular application of the inventive ceramic heater.

In the following, the improvement according to the invention is illustrated in more detail by way of examples and comparative examples.

EXAMPLE

A ceramic disc of PBN having a diameter of 100 mm and a thickness of 1 mm was provided on the upper and lower surfaces each with a resistance heater element layer of PG having a thickness of 25 $\mu$m in a pattern and relative disposition illustrated in FIGS. 1a and 1b, respectively, by the chemical vapor-phase deposition method to give a double-layered ceramic heater. The patterned heater element layers 2,2' had a width of 9 mm while the width of the gap spaces 3,3' was 3.0 mm.

The double-layered ceramic heater was subjected to an energizing test in a vacuum chamber by supplying an electric power of 1.0 kW to measure the temperature distribution on the upper surface thereof along a radius after a steady state had been established with a temperature of 1000° C. at the center to give the re-sult graphically shown in FIG. 3, from which it is understood that the temperature distribution in the radial direction is very uniform within a circular area of 60 mm diameter.

COMPARATIVE EXAMPLE

Figure 5:
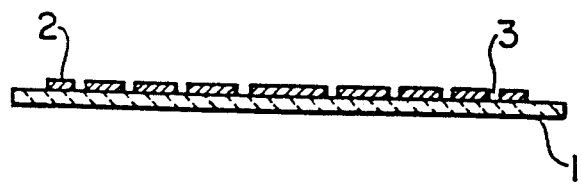
FIG. 5 is an axial cross sectional view of the single-layered ceramic heater shown in FIG. 4 as cut and viewed along the arrows V—V in FIG. 4.

A single-layered ceramic heater was prepared by forming, on one surface of a ceramic base plate 1 of PBN having a diameter of 100 mm and a thickness of 1 mm, an electric resistance layer 2 of PG having a thickness of 50 $\mu$m patterned in a double-spiral form illustrated in FIG. 4 for a plan view and in FIG. 5 for an axial cross sectional view. The electric resistance layer of the heating area had a width of 9 mm while the width of the gap area was 3 mm.

Figure 6:
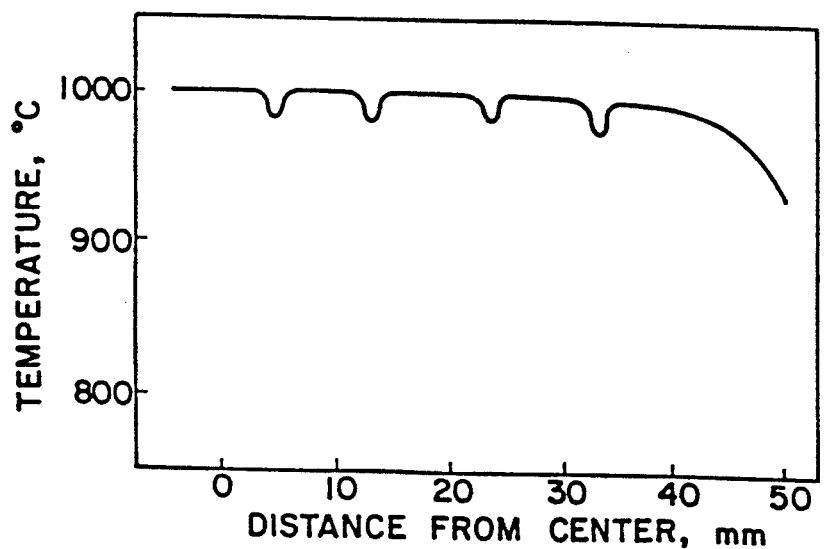
FIG. 6 is a graph showing the temperature distribution along a radius on the single-layered ceramic heater shown in FIGS. 5 and 6.

This comparative ceramic heater was subjected to an energizing test by connecting the terminals 4, 4 to a power supply source in the same manner as in Example to supply an electric power of 1.0 kW and the temperature distribution on the upper surface was measured along a radius to give the results shown in FIG. 6, from which it is understood that, although the temperature was generally uniform with the center at 1000° C. within a 60 mm diameter region, a temperature drop was found at several spots corresponding to the gap area of the heater element layer 2.

What is claimed is:

1. In a double-layered ceramic heater consisting of an electrically insulating ceramic base plate and two resistance heater element layers formed on the upper and lower surfaces of the ceramic base plate each in a pattern having, on the surface of the ceramic base plate, a heating area covered by the resistance heater element layer where heat is evolved by electric resistance and a gap area where the resistance heater element layer is not formed, the improvement which comprises forming the resistance heater element layers each in such a patterned fashion that the gap area of the heater element layer on the upper surface of the base plate is opposite face-to-face with the heating area on the lower surface and the gap area on the lower surface of the base plate is opposite face-to-face with the heating area on the upper surface with the ceramic base plate inbetween and wherein the width of the gap space for one of the heater element layers is in the range from 0.5 to 5.0 mm and is smaller than the width of the heating area thereof.

2. The improvement as claimed in claim 1 in which the ceramic base plate is formed from pyrolytic boron nitride.

3. The improvement as claimed in claim 1 in which the resistance heater element layer is formed from pyrolytic graphite.

4. The improvement as claimed in claim 1 in which the ceramic base plate has a thickness in the range from 0.5 to 5.0 mm.

* * * * *